(12) United States Patent
Jäger et al.

(10) Patent No.: US 7,534,634 B2
(45) Date of Patent: May 19, 2009

(54) SURFACE-MOUNTABLE LIGHT-EMITTING DIODE LIGHT SOURCE AND METHOD OF PRODUCING A LIGHT-EMITTING DIODE LIGHT SOURCE

(75) Inventors: Harald Jäger, Pfreimd (DE); Klaus Höhn, Taufkirchen (DE); Reinhold Brunner, Zell (DE)

(73) Assignee: Osram GmbH (DE)

( * ) Notice: Subject to any disclaimer, the term of this patent is extended or adjusted under 35 U.S.C. 154(b) by 246 days.

(21) Appl. No.: 11/456,301

(22) Filed: Jul. 10, 2006

(65) Prior Publication Data

US 2006/0244000 A1    Nov. 2, 2006

Related U.S. Application Data

(62) Division of application No. 10/186,661, filed on Jul. 1, 2002, now Pat. No. 7,098,588.

(51) Int. Cl.
*H01L 21/00* (2006.01)

(52) U.S. Cl. .............................. 438/22; 438/23; 438/24; 438/106; 438/127; 257/E25.001; 257/E25.019

(58) Field of Classification Search ................. 438/123, 438/22, 24; 257/66, E25.001
See application file for complete search history.

(56) References Cited

U.S. PATENT DOCUMENTS

| | | | |
|---|---|---|---|
| 3,935,501 A | 1/1976 | Sterbal | |
| 4,160,308 A | 7/1979 | Courtney et al. | ............... 438/25 |
| 4,334,035 A | 6/1982 | Fujita et al. | ................... 525/34 |
| 4,412,135 A | 10/1983 | Awaji | ......................... 250/551 |
| 4,712,017 A | 12/1987 | Kamasaki | ................... 250/551 |
| 5,145,889 A * | 9/1992 | Wada et al. | ................. 523/451 |
| 5,436,492 A | 7/1995 | Yamanaka | .................. 257/433 |
| 5,770,867 A | 6/1998 | Sata et al. | ..................... 257/81 |

(Continued)

FOREIGN PATENT DOCUMENTS

CN     1228873 A     9/1999

(Continued)

OTHER PUBLICATIONS

Published International Application No. 97/50132 (Reeh et al.), dated Dec. 31, 1997.

(Continued)

*Primary Examiner*—Walter L Lindsay, Jr.
*Assistant Examiner*—Abdulfattah Mustapha
(74) *Attorney, Agent, or Firm*—Fish & Richardson P.C.

(57) ABSTRACT

A surface-mountable light-emitting diode light source is described, in which the leadframe-bends toward the rear side of the package that are required for surface mounting lie within a transparent plastic molded body. Also described is a method of producing a mixed-light, preferably white-light source on the basis of a UV- or blue-emitting semiconductor LED. The LED is mounted on a leadframe, a transparent plastics molding composition is mixed with a conversion substance and possibly further fillers to form a molding composition. The leadframe is encapsulated, preferably by the injection-molding process, with the molding composition in such a way that the LED is surrounded on its light-exiting sides by the molding composition.

23 Claims, 1 Drawing Sheet

U.S. PATENT DOCUMENTS

| | | | |
|---|---|---|---|
| 5,777,433 A | 7/1998 | Lester et al. | |
| 5,792,822 A * | 8/1998 | Miyabayashi et al. | 526/240 |
| 6,060,729 A | 5/2000 | Suzuki et al. | 257/99 |
| 6,066,861 A * | 5/2000 | Hohn et al. | 257/99 |
| 6,197,413 B1 * | 3/2001 | Gueret | 428/297.4 |
| 6,277,301 B1 | 8/2001 | Hohn et al. | 252/301.36 |
| 6,812,500 B2 | 11/2004 | Reeh et al. | |
| 2003/0156425 A1 * | 8/2003 | Turnbull et al. | 362/545 |

FOREIGN PATENT DOCUMENTS

| | | | |
|---|---|---|---|
| DE | 3804293 | A1 | 8/1989 |
| DE | 4003842 | A1 | 8/1990 |
| DE | 3153142 | C2 | 11/1991 |
| DE | 19604492 | C1 | 6/1997 |
| DE | 19638667 | A1 | 4/1998 |
| DE | 29901093 | U1 | 5/1999 |
| EP | 0646971 | A2 | 4/1995 |
| JP | 60-101141 | | 6/1985 |
| JP | 5-37008 | | 2/1993 |
| JP | 5-37008 | | 12/1993 |
| JP | 9-83013 | | 3/1997 |
| WO | 97/50132 | | 12/1997 |

OTHER PUBLICATIONS

Published International Application No. 98/54929 (Vriens et al.), dated Dec. 3, 1998.

Japanese Patent Abstract No. 10093146 A (Yoshiaki et al.), dated Apr. 10, 1998.

D. J. Robbins. "The Effects of Crystal Field and Temperature on the Photoluminescence Excitation Efficiency of Ce in YAG". J. Electrochem. Soc. 126(9):1550-1555, Sep. 1979.

* cited by examiner

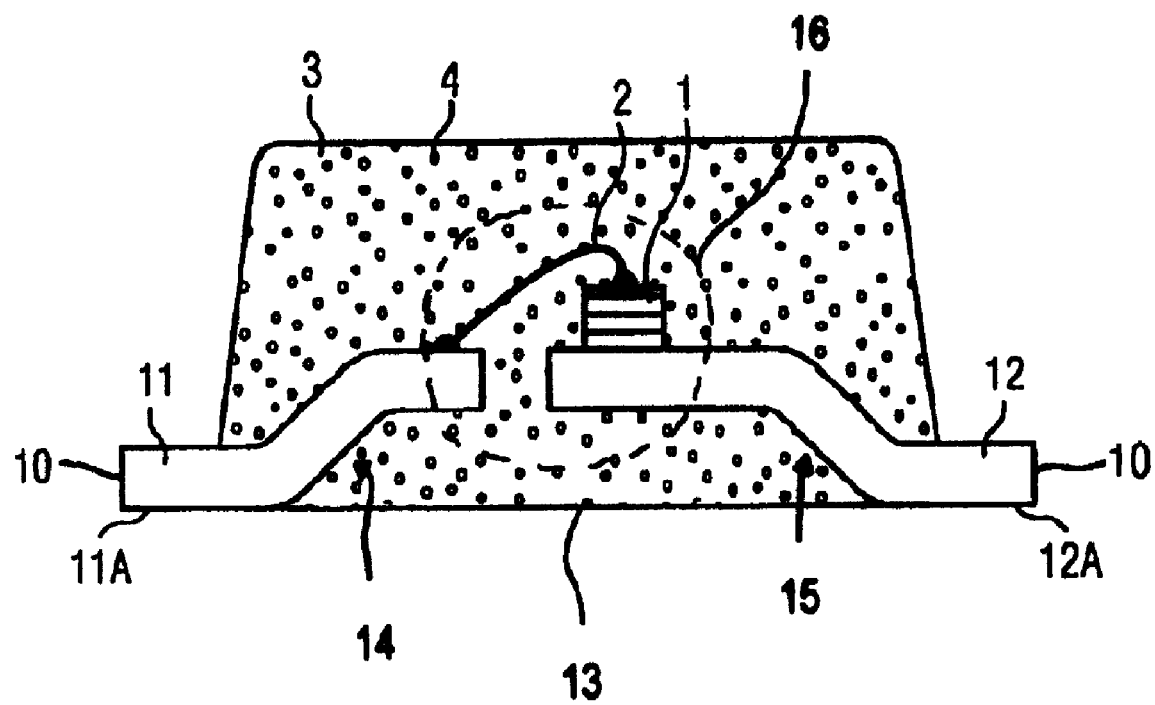

SURFACE-MOUNTABLE LIGHT-EMITTING DIODE LIGHT SOURCE AND METHOD OF PRODUCING A LIGHT-EMITTING DIODE LIGHT SOURCE

CROSS-REFERENCE TO RELATED APPLICATION

This application is a divisional application and claims priority to U.S. application Ser. No. 10/186,661, filed on Jul. 1, 2002, now U.S. Pat. No. 7,098,588 which in turn claims priority to International Application No. PCT/DE00/04660, filed Dec. 28, 2000, which designated the United States and was not published in English. The disclosure of the prior applications are considered part of. and are incorporated by reference, in the disclosure of this application.

BACKGROUND OF THE INVENTION

Field of the Invention

The invention relates to a surface-mountable light-emitting diode light source. In the surface-mountable light-emitting diode light source, a LED chip is mounted on a leadframe and the leadframe is encapsulated with a one-piece transparent plastic molded body. A leadframe connection for the LED chip protrudes from the transparent plastic molded body on each of at least two side faces.

The invention also relates to a method of producing a light source on the basis of a semiconductor light-emitting diode (hereafter referred to as semiconductor LED), in particular a surface-mountable semiconductor LED. It further relates to producing a semiconductor LED mixed-light source, in particular a white-light source.

A surface-mountable LED component with solder connection parts protruding from the package is described in International PCT publication WO 98/12757. In that device, the solder connection strips of a leadframe, extending from the chip mounting surface in a straight line in the plane of the mounting surface, are led out from a plastic package. When outside the plastic package, the solder connection strips are bent toward the component mounting side in an S-shaped manner, so that solder connection areas are produced after the S bend. With the solder connection surfaces, the component can be mounted on a printed circuit board.

WO 98/12757 also describes a wavelength-converting molding composition for an electroluminescent component with a body emitting ultraviolet, blue or green light on the basis of a transparent epoxy resin that is mixed with a luminescent substance (in particular, with an inorganic luminescent pigment powder with luminescent pigments from the group of phosphors). A white-light source is described as a preferred embodiment in which a radiation-emitting semiconductor LED on the basis of GaAlN with an emission maximum between 420 nm and 460 nm is used together with a luminescent substance, which is chosen such that a blue radiation emitted by the semiconductor body is converted into complementary wavelength ranges (in particular blue and yellow, or to additive color triads, for example, blue, green and red). The yellow, green and red light is produced by the luminescent substances. The color tone (color locus in the chromaticity diagram) of the white light produced in this way can be varied by suitable choice of the luminescent substance or substances with regard to mixing and concentration.

Similarly, International PCT publication WO 98/54929 discloses a visible light-emitting semiconductor component with a UV/blue LED, which is disposed in a depression in a supporting body, the surface of which has a light-reflecting layer and is filled with a transparent material. The transparent material surrounds the LED on its light-exiting sides. The transparent material has a refractive index that is lower than the refractive index of the light-active region of the LED to improve the coupling out of the light.

Japansese patent application No. JP 05 037 008 discloses a surface-mountable LED component. Solder connection strips are led out on the underside of a molded plastic body from the plastic body. At the point at which they leave, the solder connection strips are bent out of the plastic body in such a way that their ends point horizontally outward in a straight line along the underside of the plastic body.

German Patent DE 196 04 492 C1 describes a radial construction of LED components. However, such a construction is not suitable for surface mounting, but only for through-hole mounting on a printed circuit board. The plastic encapsulation of the package, which substantially defines the radial construction, is made of polycarbonate.

Japansese patent Application No. JP-10093146 A describes a radial LED component. A luminescent substance excited by the radiation of the semiconductor LED chip and emitting at a relatively great wavelength is incorporated in the plastic encapsulation of the package to improve the radiation intensity and brightness.

A radial LED construction is described in U.S. Pat. No. 5,777,433 also. Nanoparticles, which have a greater refractive index than the transparent encapsulating material are incorporated in the radial plastic encapsulation to increase the refractive index of the plastics material. The radial plastic encapsulation contains, for example, epoxy or some other suitable transparent organic encapsulating material.

German patent application DE 38 04 293 discloses a white-light source on the basis of a semiconductor LED. A configuration with an electroluminescent or laser diode is described, in which the emission spectrum emitted by the diode is displaced toward greater wavelengths via an element of plastic mixed with a phosphorescent, light-converting organic dye.

As a result, the light emitted by the configuration has a different color than the light emitted by the light-emitting diode. Depending on the type of dye incorporated in the plastic, configurations of light-emitting diodes that illuminate in different colors can be produced with only one light-emitting diode.

In many potential areas of application for light-emitting diodes, for example, in the case of display elements in a motor-vehicle dashboard, illumination in aircraft and cars and in the case of full-color LED displays and in portable devices with display elements or back-lit parts (e.g., in the case of cell phones), the requirement for particularly space-saving configurations of light-emitting diodes is increasing. Corresponding LED components with which mixed-colored light, in particular white light, can be produced are required.

In the case of conventional surface-mountable constructions described above, firstly a prepackaged component is produced by encapsulating a prefabricated leadframe with a suitable plastics material, which forms the package of the component. This component has a depression, on the upper side, into which leadframe connections are inserted from two opposite sides. A semiconductor LED is adhesively attached and electrically bonded to one of the connections. Then the depression is filled with an encapsulating composition, for example, a transparent epoxy resin mixed with the luminescent substance.

The advantage of the conventional surface-mountable constructions is that a very directed emission can be achieved and the side walls formed by the plastic package can be formed as tilted reflectors. However, in the applications in which such a directed emission is not absolutely necessary, the method of production is relatively complex and contains multiple stages, since the plastic of the package and the encapsulating composition are formed by two different materials and have to be molded-on in separate method steps. Moreover, the problem of an adequate and temperature-stable bond between the encapsulating composition and the plastic of the package must always be solved. This repeatedly leads to problems in practice, in particular where high light outputs are used. Further, the extent to which miniaturization can be carried out is limited by the two-part form of the package.

The extent to which the radial constructions described above can be miniaturized is likewise greatly restricted because of the required through-hole mounting. Furthermore, with the circuit configurations nowadays generally produced by surface mounting, the through-hole mounting represents a separate mounting step that is technically different from surface mounting.

SUMMARY OF THE INVENTION

It is accordingly an object of the invention to provide a surface-mountable light-emitting diode light source and method of producing a light-emitting diode light source that overcomes the hereinafore-mentioned disadvantages of the heretofore-known devices of this general type.

The present invention is based in particular on the object of providing a surface-mountable light-emitting diode light source, which has a small space requirement. It is also intended to specify a method of producing a light source, in particular a surface-mountable light source, on the basis of a semiconductor LED, which manages with a smaller number of production steps, said light source having improved properties with regard to temperature resistance during use than the known arrangements. Furthermore, the production of a mixed-color LED light source, in particular a white-light light source, is to be specified.

With the foregoing and other objects in view, there is provided, in accordance with the invention, a surface-mountable light-emitting diode light source containing a mounting side, a chip mounting region, a leadframe and a LED chip mounted on the leadframe. It also contains a one-piece transparent plastic molded body encapsulating the leadframe and the mounting side and leadframe connections for the LED chip, protruding on each of at least two side faces. Each of the leadframe connections have an S-shaped bend between the LED chip and the mounting side, which extends from the chip mounting region to the mounting side, within the plastic molded body of the light-emitting diode light source.

In the method according to the invention, a semiconductor LED with an emission spectrum in the ultraviolet or blue spectral range is used. The semiconductor LED is surrounded on its light-exiting sides by a molding composition which contains a conversion substance, by which the light spectrum emitted by the semiconductor LED is converted at least partially into light of other wavelengths, so that the optical impression of a white-light source is produced; thus, the light source overall sends out white light.

The method includes producing a light source, in particular a surface-mountable light source, on the basis of a semiconductor LED, which manages with a smaller number of production steps. The light source has improved properties with regard to temperature resistance during use than the conventional configurations. Furthermore, the production of a mixed-color LED light source, in particular a white-light light source, is to be specified.

The first-mentioned object is achieved by a surface-mountable light-emitting diode light source.

In the case of the surface-mountable light-emitting diode light source of the type, according to the invention, each of the leadframe connections within the transparent molded plastic body has an S-shaped bend by which the connection is led from a chip mounting region to a mounting side of the light-emitting diode light source.

The leadframe connections are consequently already led out of the plastic package or the molded body in its mounting plane. Consequently, the undersides of the leadframe connections already lead in the plane of the underside of the molded plastic body out of the latter and no longer need to have a bend on the outside. This causes, on the one hand, an increased space requirement, and, on the other hand, mechanical loading of the molded plastic body during the bending process. The latter entails the risk of delamination between the molded plastic body and the leadframe, which generally leads to reduced moisture stability.

The second-mentioned object is achieved by a method of producing a mixed-light source, in particular a white-light source.

Further developments of the method are also included.

The method is used with particular preference for producing a white-light source on the basis of a semiconductor LED which emits light radiation in the ultraviolet or blue spectral range. The LED is mounted on a leadframe and electrically bonded, a transparent plastics molding composition is mixed with a conversion substance, and the leadframe is encapsulated with the molding composition, preferably by the transfer molding process, in such a way that the LED is surrounded by the molding composition on its light exiting sides.

Thus, the method according to the invention dispenses with the forming of a depression and the use of two different materials. Instead, the invention envisions the use of a single transparent plastics molding composition, which is first mixed with the conversion substance and then molded around the leadframe, which is preferably injection-molded. Consequently, the cured molding composition simultaneously serves as a component package and as a transparent conversion substance matrix. The method of production is made considerably easier, since both the package is formed and the conversion substance is prepared in a single molding-on process, in particular a transfer molding process.

Furthermore, a component which has improved stability properties is produced, since the problem of adhesion between two materials which may also have different coefficients of thermal expansion no longer occurs.

A reproducible and specific setting of the color loci within narrow limits is achieved by ruling out the sedimentation of the conversion substances to the greatest extent during storage and processing, in particular by rapid gelation steps. The quality of the conversion substances is increased by simple method steps with more simple metering possibilities and minimizing the abrasion during the resin preparation, mixing and metering.

By processing luminescent substances with transparent solid resins via molding composition processes for luminescence conversion elements, the sedimentation behavior of the inorganic luminescent substances is decisively improved during the production, storage and processing of the converter resins. Consequently, the x-y color loci of the white-light sources are subject to only minor fluctuations and the emitting pattern of the luminescent diodes is improved. There is no longer any need for laborious dispersing-in of the luminescent substance for agglomerate-free converter casting resins and for setting stable viscosities even during the storage of the casting resin, just as there is no longer any need for complex packaging in the form of syringes.

Transparent molding compositions, for example, in the form of tablets or granules, are mixed together with the luminescent substance by grinding and possibly screening. The sedimentation of the luminescent substance during production and storage can consequently be prevented to the greatest extent.

The use of only a single body, molded from the molding composition for the package and the conversion substance matrix, provides scope for further miniaturization. This additional miniaturization potential can be used for the application of these white-light sources in mobile electronic product systems. Increased light yields brought about by increased utilization of the lateral radiation in special installation situations with further degrees of freedom of design or straightforward lateral light coupling-out possibilities broaden the functionality.

The plastics molding composition as a starting material may be a commercially available molding composition, and, for example, substantially contain an epoxy cresol novolak or epoxy resin system with an anhydride or phenol hardener system.

The conversion substance may be an inorganic luminescent pigment powder with luminescent pigments from the group of phosphors with the general formula $A_3B_5X_{12}$:M, which are dispersed in the plastics molding composition. In particular, particles from the group of Ce-doped garnets may be used as luminescent pigments; Ce-doped yttrium aluminum garnet ($Y_3Al_5O_{12}$:Ce) are of worthy of mention. Further conceivable conversion substances include sulfide- and oxysulfide-based host lattices, aluminates, borates with metal centers that can be appropriately excited in the shortwave range. Organometallic luminescent systems can also be considered.

The luminescent substance may similarly be formed by soluble and sparingly soluble organic dyes and luminescent substance mixtures.

Furthermore, an adhesion promoter, preferably in liquid form, can be admixed with a preferably pre-dried conversion substance, in order to improve the adhesiveness of the conversion substance with the plastics molding composition. In particular, when inorganic luminescent pigments are used, 3-glycidoxy-propyltrimethoxysilane or further trialkoxysilane-based derivatives can be used as adhesion promoters.

To modify the surfaces of the luminescent substances, single- and multi-functional polar agents with carboxylic-acid, carboxylic-ester, ether and alcohol groups, for example, diethyleneglycol-monomethylether, may be used. Consequently, the wettability of the high-energy surfaces of the luminescent material, and consequently the compatibility and dispersion during processing with the molding composition, can be improved.

Furthermore, before mixing with the conversion substance, a demolding or release agent may be admixed with the plastics molding composition. Demolding agents of this type make it easier for the cured molding composition to be released from the transfer mold. A solid wax-based demolding agent or metallic soap with long-chain carboxylic acids. In particular, stearates may be used as a demolding agent.

Inorganic fillers, via which the refractive index of the molding composition can be increased, thereby allowing the light yields of the white-light source to be increased, may be admixed as further fillers. For example, $TiO_2$, $ZrO_2$ and $\alpha$-$Al_2O_3$, can be used as such fillers.

In a preferred way, the conversion substance and possibly further fillers are mixed in that they are initially coarsely mixed and then the mixture is ground in a mill, whereby a very fine, homogeneous powder is obtained.

The mixed molding composition may consequently contain the following constituents (in % by weight):
a) plastics molding composition $\geq 60\%$
b) conversion substance $>0$ and $\leq 40\%$
c) adhesion promoter $\geq 0$ and $\leq 3\%$
d) demolding agent $\geq 0$ and $\leq 2\%$
e) surface modifier $\geq 0$ and $\leq 5\%$
f) oxidation stabilizer $\geq 0$ and $\leq 5\%$ (for example phosphite-based or based on stearically hindered phenols)
g) UV light stabilizer $\geq 0$ and $\leq 2\%$.

In a preferred embodiment, the method may be carried out in such a way that a surface-mountable component is thereby produced.

Other features which are considered as characteristic for the invention are set forth in the appended claims.

Although the invention is illustrated and described herein as embodied in a surface-mountable light-emitting diode light source and a method of producing a light-emitting diode light source, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The sole FIGURE shows an exemplary embodiment of a white-light source according to the invention, represented in a cross section along a longitudinal axis of a leadframe.

DESCRIPTION OF THE PREFERRED EMBODIMENTS

Referring now to the single FIGURE of the drawing, it is seen that in a leadframe 10 (which originally is an integral piece), two leadframe connections 11 and 12 are formed (originally still held together in a way known per se) by narrow connecting webs. The leadframe connections 11 and 12 are isolated from each other in the course of a generally multi-stage encapsulation in plastic when the connecting webs are broken. On the inner end portion of the leadframe connection 12, a semiconductor LED 1 is adhesively attached by an electrically conducting connecting agent, such as conductive silver or the like, so that the n or p side of the semiconductor LED 1 is connected to the leadframe connection 12. The opposite n- or p-conducting contact side is connected to the end portion of the other leadframe connection 11 by a bonding wire 2.

The leadframe 10, on which the LED chip 1 is mounted in a chip mounting region 16, is encapsulated with a transparent plastics molding composition 3, from which a leadframe connection 11, 12 protrudes on each of two opposite side faces. Within the transparent plastics molding composition 3, each of the leadframe connections 11, 12 has an S-shaped bend 14, 15 from a chip mounting region 16 toward a mounting side 13 of the light-emitting diode light source.

It is preferred, for example, to use a resin-based plastics molding composition 3 which substantially contains a pre-reacted epoxy resin, in particular an epoxy novolak or epoxy cresol novolak. The epoxy resin is pre-reacted in particular with a phenol and/or anhydride hardener. A demolding or release agent is preferably admixed with the plastics molding composition. The demolding agent is, for example, a solid wax-based demolding agent or a metallic soap with long-chain carboxylic acids, in particular stearates.

At least one inorganic filler, such as $TiO_2$, $ZrO_2$ or $\alpha\text{-}Al_2O_3$, may be admixed with the plastics molding composition to increase the refractive index.

In the method of producing a light-emitting diode light source according to the invention, the LED chip 1 is mounted in the chip mounting region 16 on the leadframe 10 and connected in an electrically conducting manner to the leadframe connections 11, 12. The leadframe connections 11, 12 are provided with S-shaped bends 14, 15 before or after the mounting of the semiconductor LED chip 1. The semiconductor LED chip 1, including the S-shaped bends 14, 15 of the leadframe 10, is encapsulated with a transparent plastics molding composition 3, preferably by the transfer molding process.

In the case of a white-light source, the semiconductor LED 1 has an emission spectrum that lies in the ultraviolet or blue spectral range. The semiconductor LED 1 is preferably constructed on the basis of GaN or InGaN. However, it may alternatively also contain the material system ZnS/ZnSe or some other material system suitable for this spectral range.

After applying and electrically bonding the semiconductor LED 1, a transparent plastics molding composition 3 is injected onto the leadframe connections 11 and 12 in a suitable transfer molding apparatus. Luminescent particles 4, which are made of a conversion substance by which an at least partial wavelength conversion of the light radiation emitted by the semiconductor LED 1 is brought about, are embedded in the plastics molding composition 3.

The wavelength conversion has the effect of producing an emission spectrum, which induces the optical impression of a white-light source.

The prefabrication of the leadframe 10 and the encapsulation by the molding composition including the plastics molding composition 3, possibly the luminescent particles 4 and possibly further fillers, takes place in such a way that the leadframe portions 11 and 12 are led out horizontally from the molding composition. To be precise, it takes place in such a way that the solder connection areas 11A and 12A lie substantially in the same plane as the rear side 13 of the encapsulation, which generally represents the bearing surface of the component on a printed circuit board. The leadframe connections 11 and 12 have already been bent into the final form before the encapsulation for this purpose.

Consequently, the leadframe connections 11 and 12 have the S-shaped bends 14, 15 from the chip connection region 16 to the mounting surface (formed by the rear side 13 and the solder connection surfaces 11A and 12A) already before the encapsulation with plastics molding composition, so that no flexural stress is exerted any longer on the component after the plastic molded body has been produced.

This is of particular advantage, in particular in the case of highly miniaturized components with a plastic package of small volume, because of a very great risk that a hermetic seal of the finished component will not be achieved if there is delamination between the molding composition and the leadframe, initiated for example, by flexural stress.

The finished component may advantageously be soldered on a printed circuit board by the reflow process at the planar horizontal connection surfaces 11A and 12A. As a result, a component suitable for Surface Mounting Technology ("SMT"), is produced.

The preparation of the molding composition, formed by the plastics molding composition 3, the luminescent particles 4 and possibly further fillers, represents an important element of the present invention.

Pre-reacted, storage- and radiation-stable transparent molding compositions containing epoxy cresol novolaks with phenolic hardeners, the total chlorine content of which lies below 1500 ppm, are preferably used as starting substances for the plastics molding composition. These molding compositions preferably contain an internal demolding or release agent, by which the release of the cured molding composition from the injection transfer mold is made easier. However, the presence of such an internal demolding agent is not absolutely necessary. Consequently, the following commercially available molding compositions of the companies Nitto and Sumitomo can be used, for example:

Nitto NT-600 (without internal demolding agent);
Nitto NT-300H-10.000 (with internal demolding agent);
Nitto NT-300S-10.000 (with internal demolding agent);
Nitto NT-360-10.000 (with internal demolding agent); and
Sumitomo EME 700L (without internal demolding agent).

These molding compositions are supplied as standard in bar or tablet form.

The luminescent substances, which have been described in the already cited printed publications, International PCT publication WO 97/50132 and International PCT publication WO 98/12757, may be used as conversion substances. In addition, sulfide- and oxysulfide-based host lattices, aluminates, and borates with metal centers, which can be appropriately excited in the shortwave range or organometallic luminescent systems can also be used.

Furthermore, soluble and scarcely soluble organic dyes and luminescent substance mixtures may be used as conversion substances. In particular, an inorganic luminescent pigment powder with luminescent pigments from the group of phosphors with the general formula $A_3B_5X_{12}$:M, can be used as the luminescent substance; the group of Ce-doped garnets are particularly worthy of noting. In particular, particles of the luminescent pigment YAG:Ce are distinguished by particular conversion efficiency.

The conversion substance, known as the product L175, is made by the company Osram. With the conversion substance, a test for mixing with a molding composition was carried out using a molding composition of the type Nitto NT-300H-10.000 with an internal demolding agent. As preparation for the test, the conversion substance L175 was pre-dried at 200° C. for about 8 hours.

After that, a surface modifier with the designation diethyleneglycolmonomethylether in liquid form was admixed with the pre-dried converter (0.1% by weight in relation to the weight of the molding composition). This mixture was sealed in an airtight manner in a glass vessel and left to stand overnight. The conversion substance was admixed with the molding composition of the type stated above before processing. The molding composition had previously been ground in a mill (for example a ball mill) into powder form.

The mixing ratio was 20% by weight of conversion substance/DEGME mixture and 80% by weight of Nitto NT-300H-10.000. After coarse mixing of the mixture by stirring, the mixture was once again mixed thoroughly and ground in a mill (for example, a ball mill) and, consequently, very fine powder was produced.

Next, an injection-molding test was carried out with this molding composition on the apparatus of the type FICO Brilliant 100. The already appropriately prefabricated leadframe 10 was pre-heated before the encapsulation at 150° C. and the following machine parameters were set during the encapsulation:
mold temperature: 150° C.
injection time: 22.4 s
injection pressure: 73-82 bar (dependent inter alia on the amount of material set)
curing time: 120 s As a result, it was possible to achieve a very homogeneous, cured molding composition distinguished by excellent freedom from bubbles and voids. In general, it was found that the grinding of the molding composition into very fine powder, before the mixing, produced better results with regard to freedom from bubbles and voids than when a coarser-grained residual composition powder was used.

In addition, an adhesion promoter such as 3-glycidoxy-propyltrimethoxysilane, with the product designation A-187 of the company Hüls AG, may also be additionally used. This adhesion promoter can be added directly after the drying process to the luminescent substance in concentrations of up to 3% by weight and mixed with the latter overnight at room temperature.

The method according to the invention has been described according to an exemplary embodiment on the basis of an SMD construction, although it can similarly be realized in the case of a radial diode.

Further, the method according to the invention can similarly be used for producing a LED component emitting in the lateral direction, i.e., with the main direction of emission being parallel to the plane of the printed circuit board.

We claim:

1. A method of producing a white-light source with a semi-conductor LED chip that emits light radiation in ultraviolet or blue spectral range, which comprises:
   mounting the LED chip on a leadframe;
   mixing a resin that is pre-reacted with a hardener and provided in powder form with a conversion substance and optionally with further fillers to form a molding composition; and
   encapsulating the leadframe with the molding composition in such a way that the LED is surrounded by the molding composition on light exiting sides thereof.

2. The method according to claim 1, which comprises using a pre-reacted epoxy resin selected from the group consisting of epoxy novolak and epoxy cresol novolak.

3. The method according to claim 2, which comprises pre-reacting the epoxy resin with a material selected from the group consisting of phenol and anhydride hardener.

4. The method according to claim 1, which comprises selecting the conversion substance from an organic substance, an inorganic luminescent substance and a mixture thereof.

5. The method according to claim 4, wherein the inorganic luminescent substance contains a luminescent substance metal center in a host lattice on the basis of the general formula $A_3B_5X_{12}$ or a sulfide, oxysulfide, borate, aluminate or metal-chetate complexes.

6. The method according to claim 1, which comprises admixing an adhesion promoter with the conversion substance to improve the adhesiveness of the conversion substance before the mixing of the plastic molding composition.

7. The method according to claim 6, which comprises admixing the adhesion promoter in liquid form.

8. The method according to claim 1, which comprises using a member selected from the group consisting of 3-glycidoxypropyltrimethoxy-silane and further trialkoxysilane-based derivatives as adhesion promoters.

9. The method according to claim 1, admixing a surface modifier, with the conversion substance to modify the surfaces of the conversion substance, before the mixing of the plastics molding composition.

10. The method according to claim 9, which comprises admixing the surface modifier in liquid form.

11. The method according to claim 10, which comprises using diethyleneglycolmonomethylether as the surface modifier.

12. The method according to claim 1, which comprises admixing an agent selected from the group consisting of demolding agent and release agent with the plastics molding composition before mixing with the conversion substance.

13. The method according to claim 12, which comprises selecting the demolding agent from a solid wax-based molding agent and a metallic soap with long-chain carboxylic acids.

14. The method according to claim 1, which comprises:
   selecting an inorganic filler from $TiO_2$, $ZrO_2$, and $\alpha\text{-}Al_2O_3$; and
   admixing the molding composition with the inorganic filler for increasing the refractive index of the molding composition.

15. The method according to claim 1, which comprises:
   mixing the plastics molding composition and the conversion substance and optionally further fillers initially coarsely; and
   grounding the mixture in a mill and obtaining a homogenous powder.

16. The method according to claim 15, which comprises milling the plastics molding composition in a coffee mill before mixing.

17. The method according to claim 16, which comprises providing the mixed molding composition with the following constituents:
   plastics molding composition>60%
   conversion substance >0 and <40%
   adhesion promoter>and <3%
   demolding agent>0 and <2%
   surface modifier>0 and <5%
   oxidation stabilizer>0 and <5%; and
   UV light stabilizer>0 and <2%.

18. The method according to claim 1, which comprises:
   producing the light source as a surface-mountable component, and
   molding the molding composition, which includes leading out leadframe connections laterally from the molding composition on a mounting side of the completed white-light source and forming horizontal mounting surfaces.

19. A method of producing a white-light source with a semi-conductor LED chip that emits light radiation in ultraviolet or blue spectral range, which comprises:
   mounting the LED chip on a leadframe;
   mixing a transparent plastics molding composition with a conversion substance and optionally with further fillers to form a molding composition;
   admixing an agent selected from the group consisting of demolding agent and release agent with the plastics molding composition before mixing with the conversion substance; and
   encapsulating the leadframe with the molding composition in such a way that the LED is surrounded by the molding composition on light exiting sides thereof.

20. The method according to claim 19, which comprises selecting the demolding agent from a solid wax-based molding agent and a metallic soap with long-chain carboxylic acids.

21. A method of producing a white-light source with a semi-conductor LED chip that emits light radiation in ultraviolet or blue spectral range, which comprises:
  mounting the LED chip on a leadframe;
  mixing a transparent plastics molding composition with a conversion substance and optionally with further fillers to form a molding composition;
  mixing the plastics molding composition and the conversion substance and optionally further fillers initially coarsely;
  grinding the mixture in a mill and obtaining a homogenous powder; and
  encapsulating the leadframe with the molding composition in such a way that the LED is surrounded by the molding composition on light exiting sides thereof.

22. The method according to claim 21, which comprises milling the plastics molding composition in a coffee mill before mixing.

23. The method according to claim 22, which comprises providing the mixed
  molding composition with the following constituents:
  plastics molding composition>60%
  conversion substance>0 and <40%
  adhesion promoter>0 and <3%
  demolding agent>0 and <2%
  surface modifier>0 and <5%
  oxidation stabilizer>0 and <5%
  UV light stabilizer >0 and <2%.

* * * * *

UNITED STATES PATENT AND TRADEMARK OFFICE
CERTIFICATE OF CORRECTION

| | |
|---|---|
| PATENT NO. | : 7,534,634 B2 |
| APPLICATION NO. | : 11/456301 |
| DATED | : May 19, 2009 |
| INVENTOR(S) | : Harald Jäger et al. |

It is certified that error appears in the above-identified patent and that said Letters Patent is hereby corrected as shown below:

On the title page, item [75], "INVENTORS", after inventor Harald Jäger, delete "Pfreimd" and insert -- Regensburg --.

On the title page, column 1, after Related U.S. Application Data, delete "Pat. No. 7.098,588." and insert -- Pat. No. 7,098,588, which is a continuation of application No. PCT/DE00/04660 filed on December 28, 2000. -- and insert -- Foreign Application Priority Data

December 30, 1999 (DE)                                                199 63 806 --.

On title page 2, at column 1, line 15, delete "of." and insert -- of, --.

In Claim 2, at column 9, line 43, delete "1 ," and insert -- 1, --.

In Claim 5, at column 9, line 57, delete "metal-chetate" and insert -- metal-chelate --.

In Claim 6, at column 9, line 61, delete "plastic" and insert -- plastics --.

In Claim 8, at column 9, line 65, delete "3 -glycidox" and insert -- 3-glycidox --.

In Claim 13, at column 10, lines 15-16, delete "molding" and insert -- demolding --.

In Claim 17, at column 10, line 36, delete ">" and insert -- ≥ --.

In Claim 17, at column 10, line 37, delete "<" and insert -- ≤ --.

In Claim 17, at column 10, line 38, delete ">and <3%" and insert -- ≥0 and ≤3% --.

In Claim 17, at column 10, line 39, delete ">0 and <2%" and insert -- ≥0 and ≤2% --.

Signed and Sealed this
Twenty-ninth Day of May, 2012

David J. Kappos
*Director of the United States Patent and Trademark Office*

CERTIFICATE OF CORRECTION (continued)
U.S. Pat. No. 7,534,634 B2

In Claim 17, at column 10, line 40, delete ">0 and <5%" and insert -- $\geq 0$ and $\leq 5\%$ --.

In Claim 17, at column 10, line 41, delete ">0 and <5%" and insert -- $\geq 0$ and $\leq 5\%$ --.

In Claim 17, at column 10, line 42, delete ">0 and <2%." and insert -- $\geq 0$ and $\leq 2\%$. --.

In Claim 18, at column 10, lines 44-45, delete "component," and insert -- component; --.

In Claim 23, at column 12, line 6, delete "molding composition with the following constituents:" and insert the same after "mixed" at column 12, line 5 as a continuation.

In Claim 23, at column 12, line 9, delete ">0and" and insert -- >0 and --.